US 8,049,324 B1

(12) United States Patent
Zeta

(10) Patent No.: US 8,049,324 B1
(45) Date of Patent: Nov. 1, 2011

(54) PREVENTING ACCESS TO STUB TRACES ON AN INTEGRATED CIRCUIT PACKAGE

(75) Inventor: Ruben C. Zeta, Milpitas, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 320 days.

(21) Appl. No.: 11/800,304

(22) Filed: May 3, 2007

(51) Int. Cl.
H01L 23/48 (2006.01)
H01L 23/04 (2006.01)

(52) U.S. Cl. ............... 257/692; 257/730

(58) Field of Classification Search ......... 257/692, 257/704, 733, 730, 23.003, 23.004, 23.007, 257/E23.003, E23.004, 23.007 E; 205/125
See application file for complete search history.

(56) References Cited

U.S. PATENT DOCUMENTS

| | | | | |
|---|---|---|---|---|
| 5,567,295 A * | 10/1996 | Swamy et al. | ............... | 205/125 |
| 5,990,547 A * | 11/1999 | Sharma et al. | ............... | 257/700 |
| 5,994,773 A * | 11/1999 | Hirakawa | ............... | 257/702 |
| 6,013,946 A * | 1/2000 | Lee et al. | ............... | 257/684 |
| 6,313,413 B1 * | 11/2001 | Chen et al. | ............... | 174/262 |
| 6,396,135 B1 * | 5/2002 | Narvaez et al. | ............... | 257/678 |
| 6,432,291 B1 * | 8/2002 | Vivares et al. | ............... | 205/125 |
| 6,632,343 B1 * | 10/2003 | Farnworth et al. | ........... | 205/125 |
| 6,657,296 B2 * | 12/2003 | Ho et al. | ............... | 257/720 |
| 6,770,955 B1 * | 8/2004 | Coccioli et al. | ............... | 257/659 |
| 6,800,944 B2 * | 10/2004 | Buschbom | ............... | 257/778 |
| 7,075,186 B1 * | 7/2006 | Wang et al. | ............... | 257/779 |
| 7,094,701 B2 * | 8/2006 | Umemoto et al. | ........... | 438/706 |
| 7,129,578 B2 * | 10/2006 | Togawa | ............... | 257/730 |
| 7,397,129 B2 * | 7/2008 | Lee | ............... | 257/774 |
| 2005/0242437 A1 * | 11/2005 | Moxham et al. | ............ | 257/738 |

* cited by examiner

Primary Examiner — Leonardo Andujar
Assistant Examiner — Jordan Klein
(74) Attorney, Agent, or Firm — North Weber & Baugh LLP

(57) ABSTRACT

An integrated circuit (IC) package includes a printed circuit board (PCB) substrate and a plurality of package attachment terminals. The package attachment terminals are used to conduct electrical signals from a die that is attached and bonded onto the PCB substrate. The PCB substrate has a side edge and includes a plurality of electrically-conductive paths. Each one of the plurality of paths includes an electroplated bond pad, a trace, and a stub trace. The die is connected to the bond pad and the trace couples the bond pad to a respective one of the package attachment terminals. The stub trace is used to facilitate the electroplating process. The stub trace extends from the trace and terminates at a distance away from the side edge. The stub trace is not visible from the side of the IC package and therefore prevents access to IC buses on the package.

13 Claims, 6 Drawing Sheets

17 BOND WIRE
16 BOND PAD
15 COPPER TRACE
18 VIA
19 TIE BAR
20 SIDE EDGE

PREVENTING ACCESS TO STUB TRACES ON AN INTEGRATED CIRCUIT PACKAGE

TECHNICAL FIELD

The disclosed embodiments relate to integrated circuit packages having substrates with electroplated bond pads.

BACKGROUND

Integrated Circuits (ICs) are commonly packaged in surface-mount package types such as a Ball Grid Array (BGA) package. A BGA is a surface-mount package that utilizes an array of metal spheres or balls as the means of providing external electrical interconnection. The balls are composed of solder, and are attached to a Printed Circuit Board (PCB) substrate at the bottom side of the package. The IC die is mounted on the top side of the package and is connected to substrate bond pads either by wire-bonding or flip-chip connection. The PCB substrate of the package often has internal conductive copper traces that route and connect the substrate bond pads to the solder balls.

FIG. 1 (Prior Art) illustrates a simplified cross-section view of a BGA package 10. BGA package 10 includes an integrated circuit (IC) chip or die 11, a substrate 12, an external solder ball 13, and encapsulant 14. Substrate 12 includes a copper trace 15 and a bond pad or finger 16. As illustrated in FIG. 1, bond wire 17 couples an active surface of die 11 to bond pad 16, and copper trace 15 couples bond pad 16 to solder ball 13 through via 18.

Substrate bond pad 16 is normally electroplated with a layer of gold because of the excellent conductive and mechanical properties of gold. In order to facilitate the electroplating process, manufactures use tie bars to provide electrical paths to the bond pads. FIG. 2 is a top view of a portion of package 10 of FIG. 1. As illustrated in FIG. 2, copper trace 15 extends toward a side edge 20 of substrate 12 and connects to a tie bar 19. Bond pad 16 is electrically connected with other bond pads by tie bar 19 so that all the bond pads can be electroplated at the same time with a layer of gold.

FIG. 3 illustrates a perspective view of the BGA package 10 of FIG. 1. As illustrated in FIG. 3, copper trace 15 extends to side edge 20 and is visible from the side of BGA package 10. Therefore, this packaging method does not prevent a possible attacker from gaining access to IC buses on the IC chip through copper traces that extend to side edges of the substrate and are visible from the sides of the package. The attacker can probe these exposed copper traces and can learn the data on these buses and may, for example, cause a central processing unit (CPU) of the IC chip to execute malicious code. Some IC manufacturers have developed sophisticated algorithms and data encryption techniques that secure these transactions. However, more and more people are learning the algorithms and encryption methods and are able to break through the security. Therefore, it is beneficial to make it more difficult for possible attackers to access the IC buses. It is especially desirable to secure access to the IC buses designated for security sensitive transactions.

SUMMARY

An integrated circuit (IC) package includes a printed circuit board (PCB) substrate and a plurality of package attachment terminals. The package attachment terminals are used to conduct electrical signals from an IC die that is attached and bonded onto the PCB substrate. In one example, the package attachment terminals are solder balls of a Ball Grid Array (BGA) package. The PCB substrate has a side edge and includes a plurality of electrically-conductive paths. Each one of the plurality of paths includes an electroplated bond pad, a trace, and a stub trace. The die is attached to the substrate and is bonded to the bond pad. The trace couples the bond pad to a respective one of the package attachment terminals. The stub trace is used to facilitate the electroplating process. The stub trace extends from the trace and terminates at a distance away from the side edge. The stub trace is not visible from the side of the IC package and therefore prevents access to IC buses on the package.

The assembly of an IC package is accomplished on a per substrate panel basis. First, a PCB substrate panel consisting of multiple identical substrates is prepared. Bond pads on each substrate are then electroplated at the same time with gold. To facilitate the electroplating process, copper traces on each substrate are extended and connected to a tie bar such that all the bond pads are electrically connected through the tie bar. After electroplating, portions of the copper traces are removed to form stub traces and isolated stub trace segments. In one example, a top surface of the PCB substrate panel is covered by a pattern mask with openings of about 200 micrometers around the perimeter of each substrate. The PCB substrate panel is then completely submerged in an acid or solution that eats away the exposed metal through the openings. The stub traces extend from the copper traces and terminate 200 micrometers inside of the perimeter of each substrate. In another example, the openings also include short strips that cross several stub traces such that the stub traces are further disconnected to form isolated stub trace segments. In yet another example, the stub traces are entirely removed during the etching process. After the etching process, an IC die is attached and bonded to each substrate. Each IC die and the bonding wires are then encapsulated under an amount of molding compound. Finally, each substrate is separated with respect to each other substrate to form an individual IC package. Because of the etching process, neither the stub traces nor the isolated stub trace segments are visible from the side of the IC package. Therefore, it is much more difficult for a possible attacker to gain access to signals on the IC buses on the IC die.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

Strips are etched to disconnect the tie bar structure from the traces and bond pads.

Figure 6:
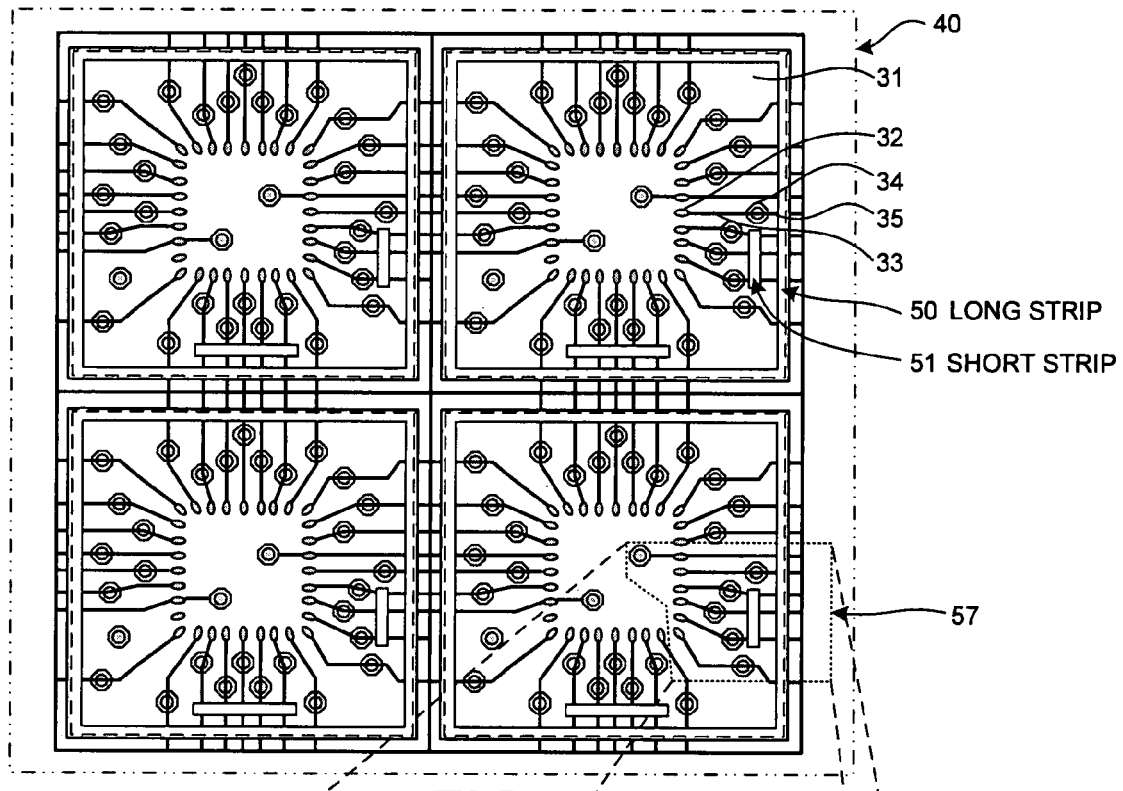
FIG. 6 is a top view of a PCB substrate panel during etching process in accordance with one novel aspect.
Figure 7:
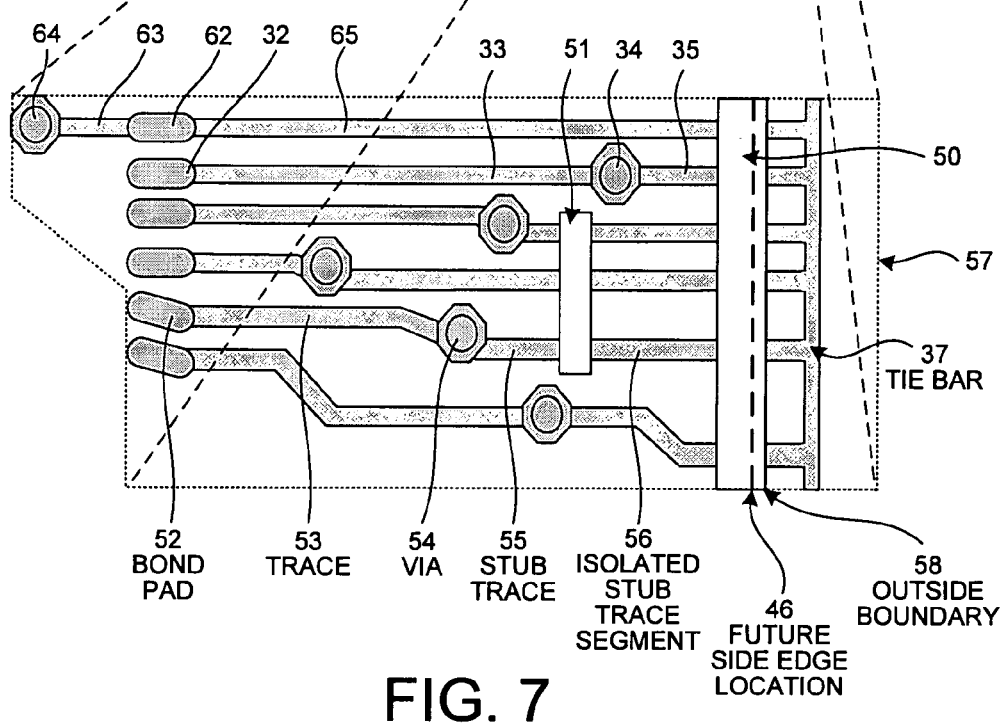

FIG. 7 is an expanded view of a portion of the substrate of FIG. 6.

Figure 8:
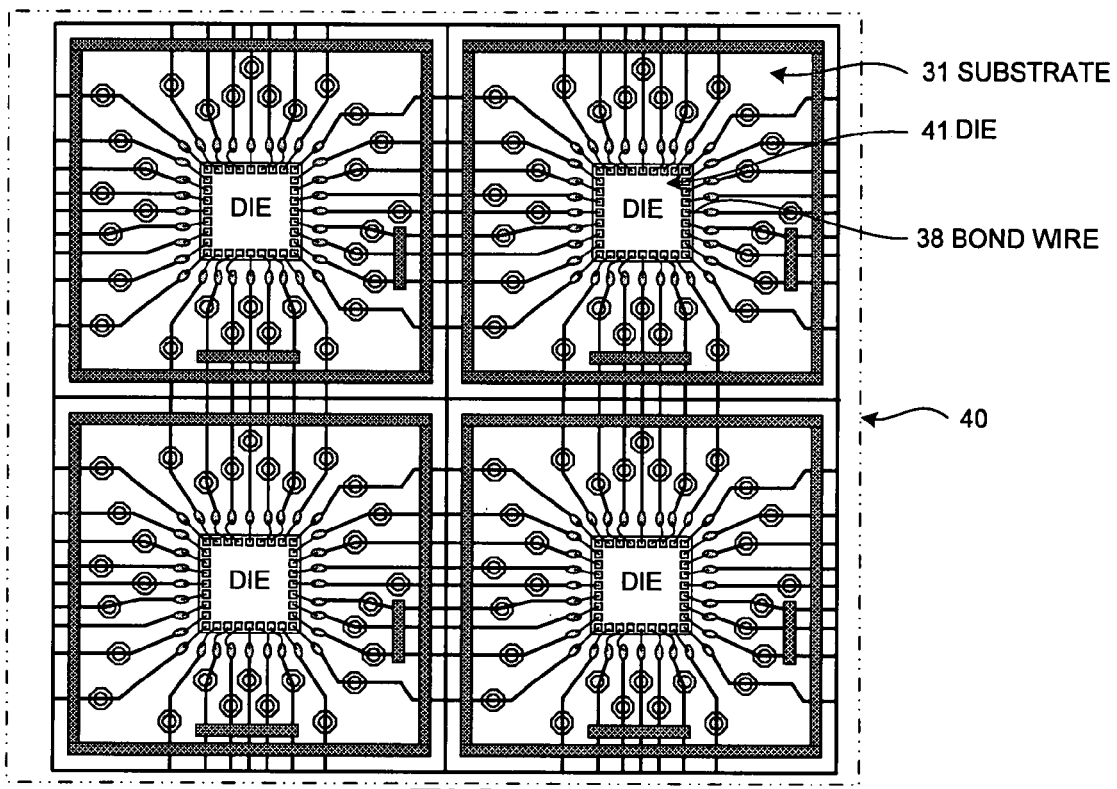

FIG. 8 is a top view of a PCB substrate panel after die attachment and wire bonding.

Figure 9:
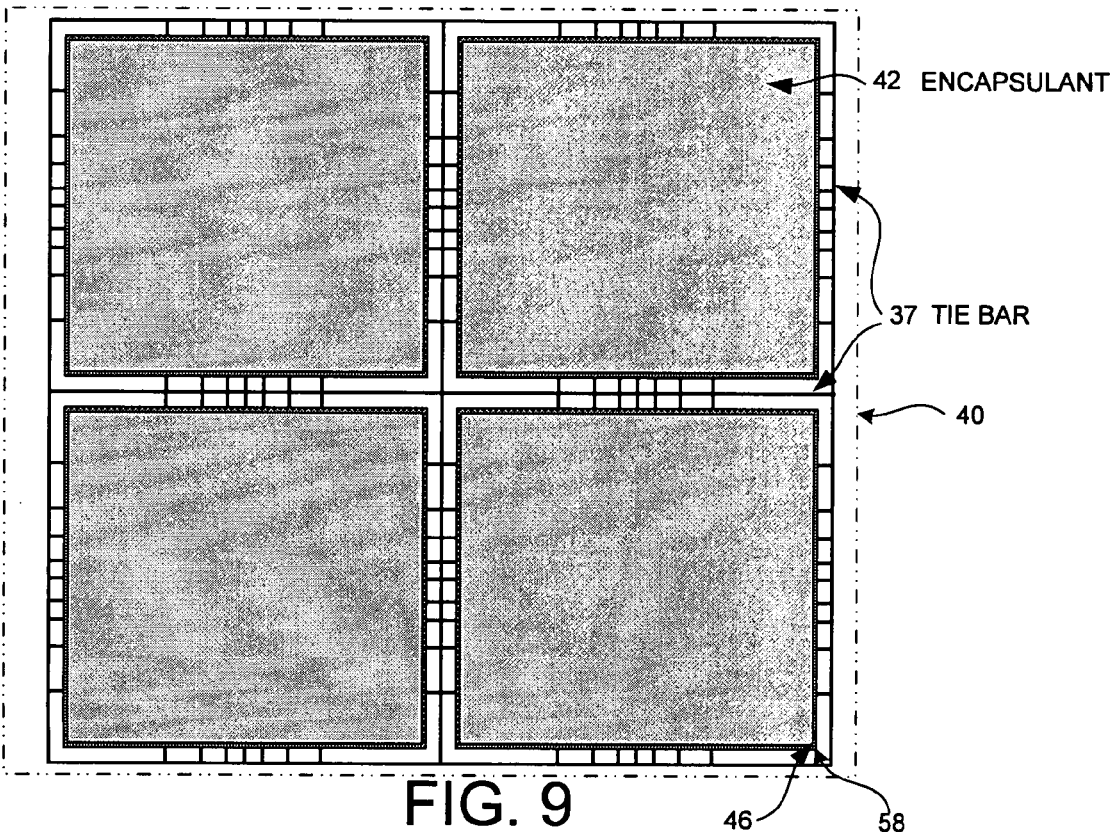

FIG. 9 is a top view of a PCB substrate panel after encapsulation.

Figure 10:
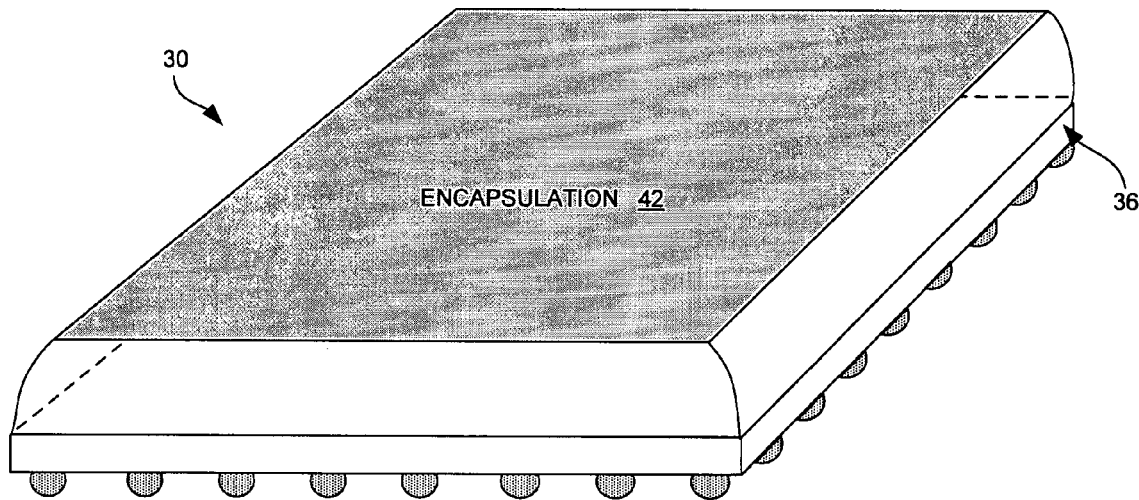

FIG. 10 is a perspective view of an individual packaged IC in accordance with one novel aspect. None of the traces is exposed on any side edge of the package.

Figure 11:
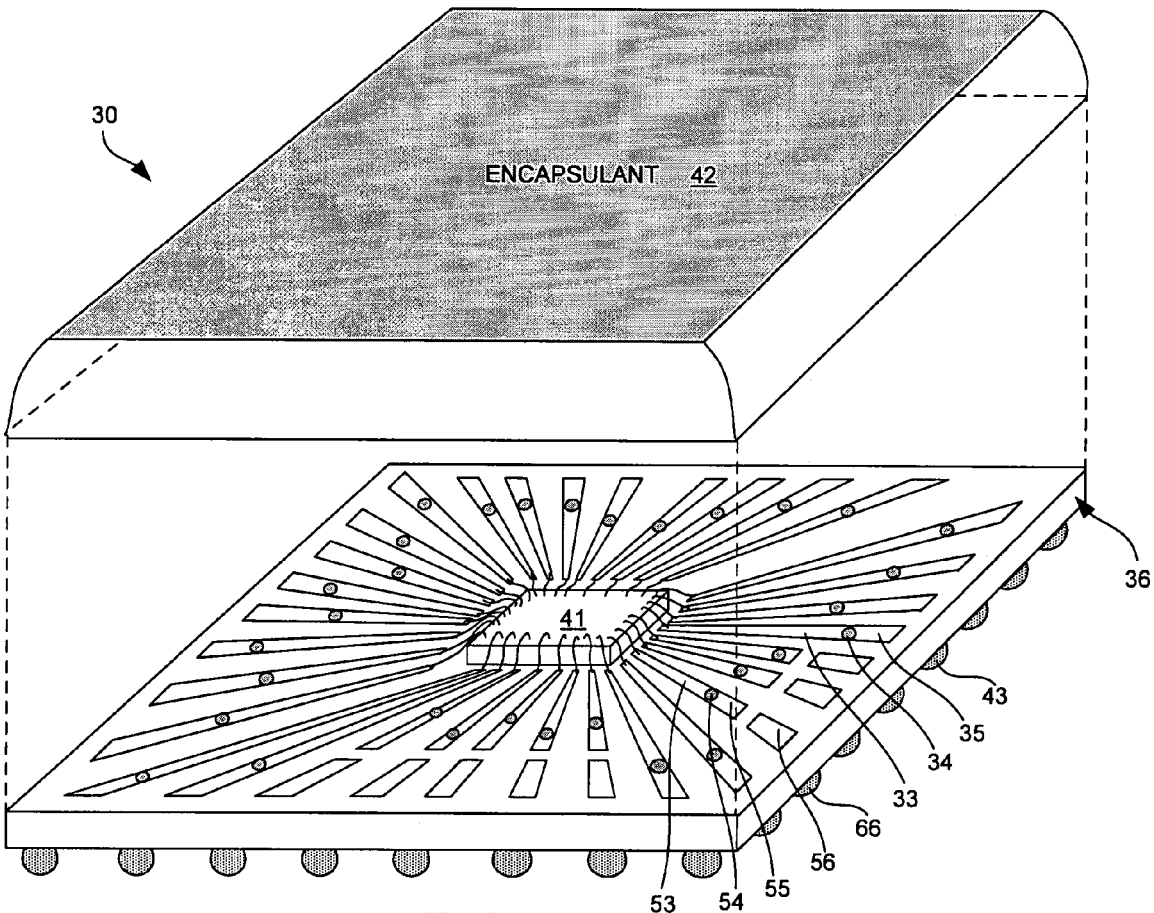

FIG. 11 is an exploded perspective view of the individual packaged IC of FIG. 10.

DETAILED DESCRIPTION

Reference will now be made in detail to some embodiments of the invention, examples of which are illustrated in the accompanying drawings.

During integrated circuit (IC) packaging, an IC chip or die is mounted on a substrate to form an encapsulated package. A Ball Grid Array (BGA) is a common surface-mount package that has a bottom surface that is covered with external solders balls in a grid pattern. These solder balls are usable to conduct electrical signals from the die to an underlying printed circuit board (PCB).

Figure 1:
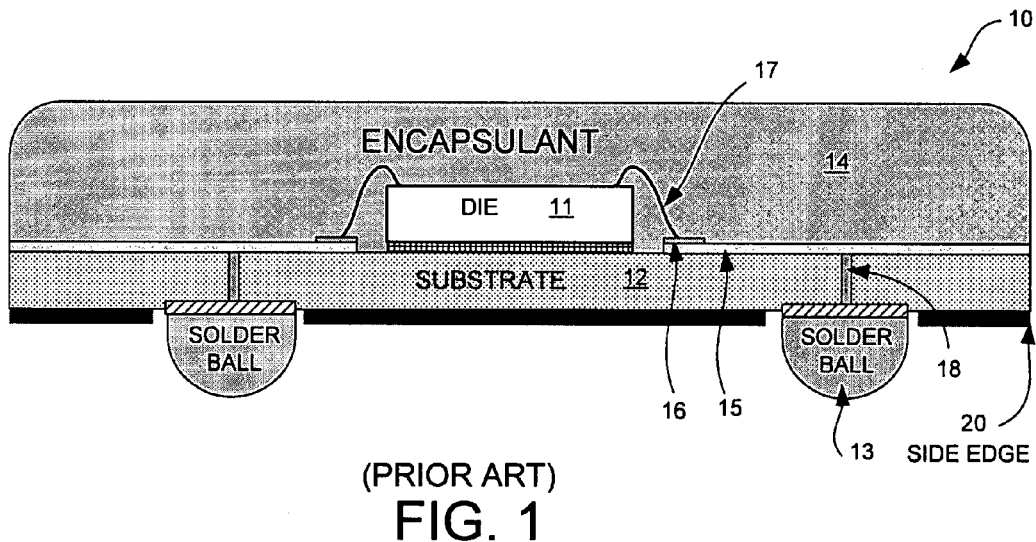
FIG. 1 (Prior Art) illustrates a simplified cross-section view of a BGA package.
Figure 2:
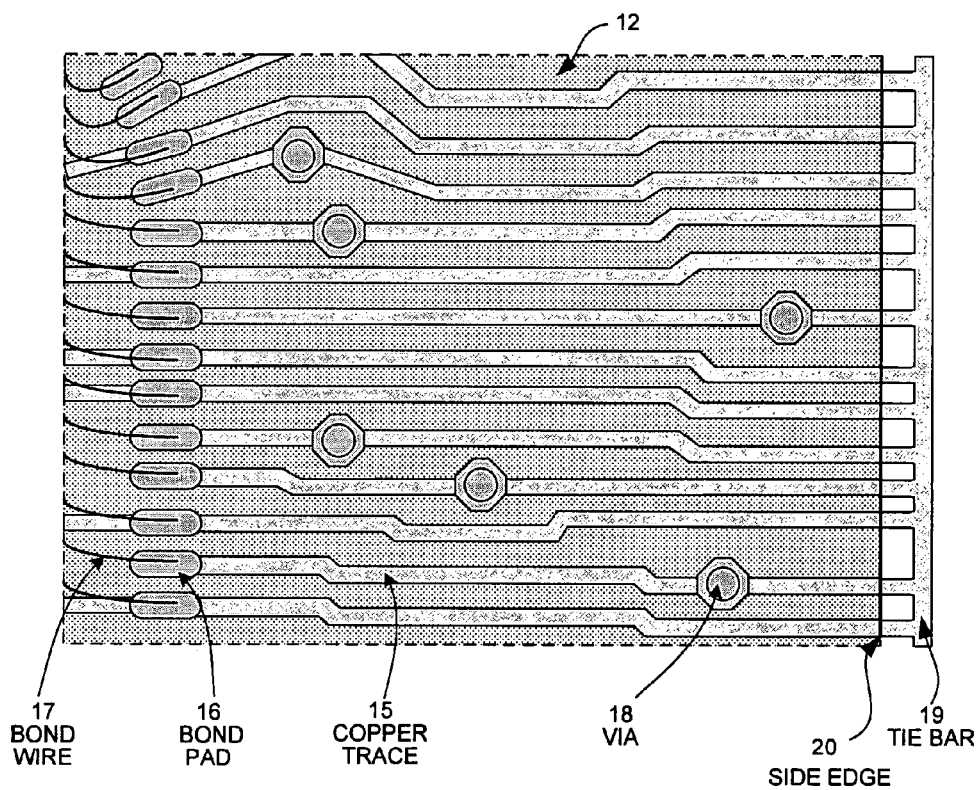
FIG. 2 (Prior Art) is a top view of a portion of the BGA package of FIG. 1.
Figure 3:
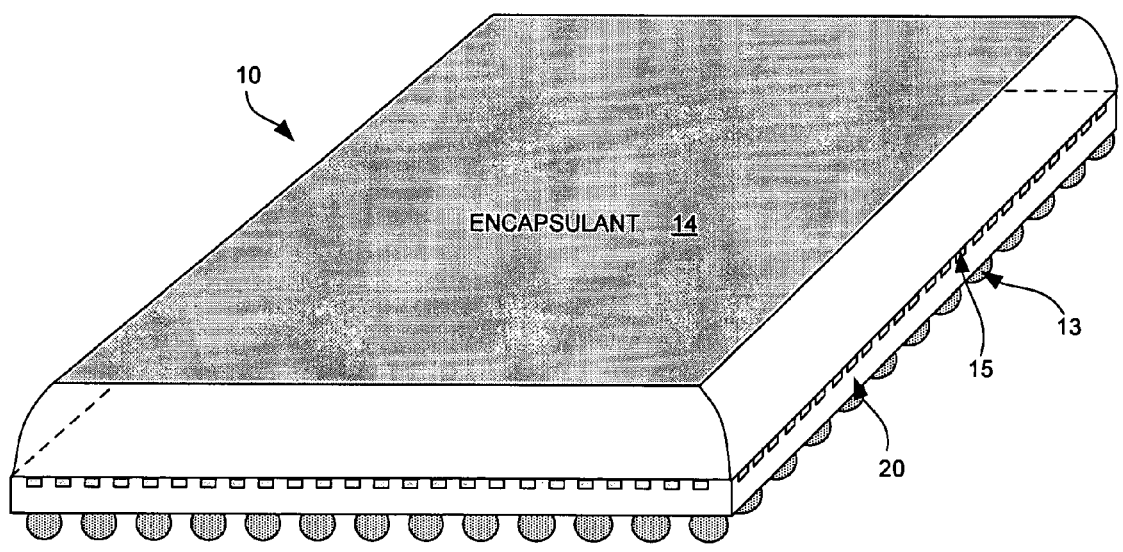
FIG. 3 (Prior Art) is a perspective view of an individual packaged IC.
Figure 4:
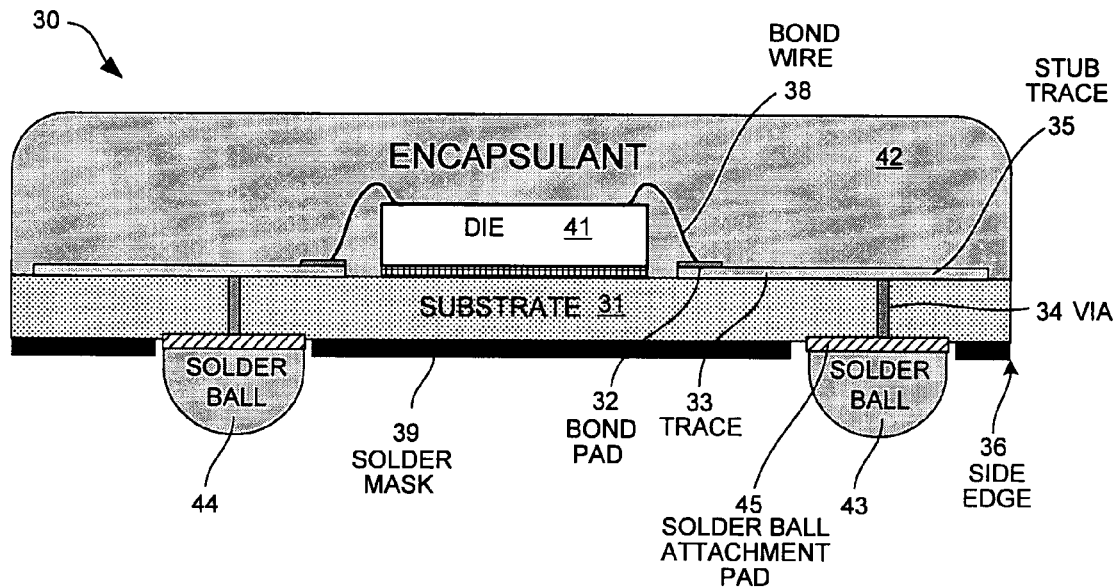
FIG. 4 illustrates a simplified cross-section view of a BGA package in accordance with one novel aspect.

FIG. 4 illustrates a simplified cross-section view of a BGA package 30 in accordance with one novel aspect. Package 30 includes a die 41, a PCB substrate 31, encapsulant 42, and external solder balls 43 and 44. Substrate 31 includes a bond pad 32, an electrically-conductive trace 33 (for instance, a copper trace), and a stub trace 35. Substrate 31 also has a side edge 36. External solder balls 43 and 44 are separated by solder mask 39. As illustrated in FIG. 4, die 41 is attached to a top surface of substrate 31 and is connected to bond pad 32 through bond wire 38. Solder ball 43 is attached to a bottom surface of substrate 31 by attaching to a solder ball attachment pad 45. Copper trace 33 routes and connects bond pad 32 to solder ball 43 through a conductive through hole or via 34. Thus, an electrical signal path extends from die 41 through bond wire 38, through bond pad 32, through copper trace 33, through via 34, and through solder ball 43 to a trace on an underlying printed circuit board (not shown).

Figure 5:
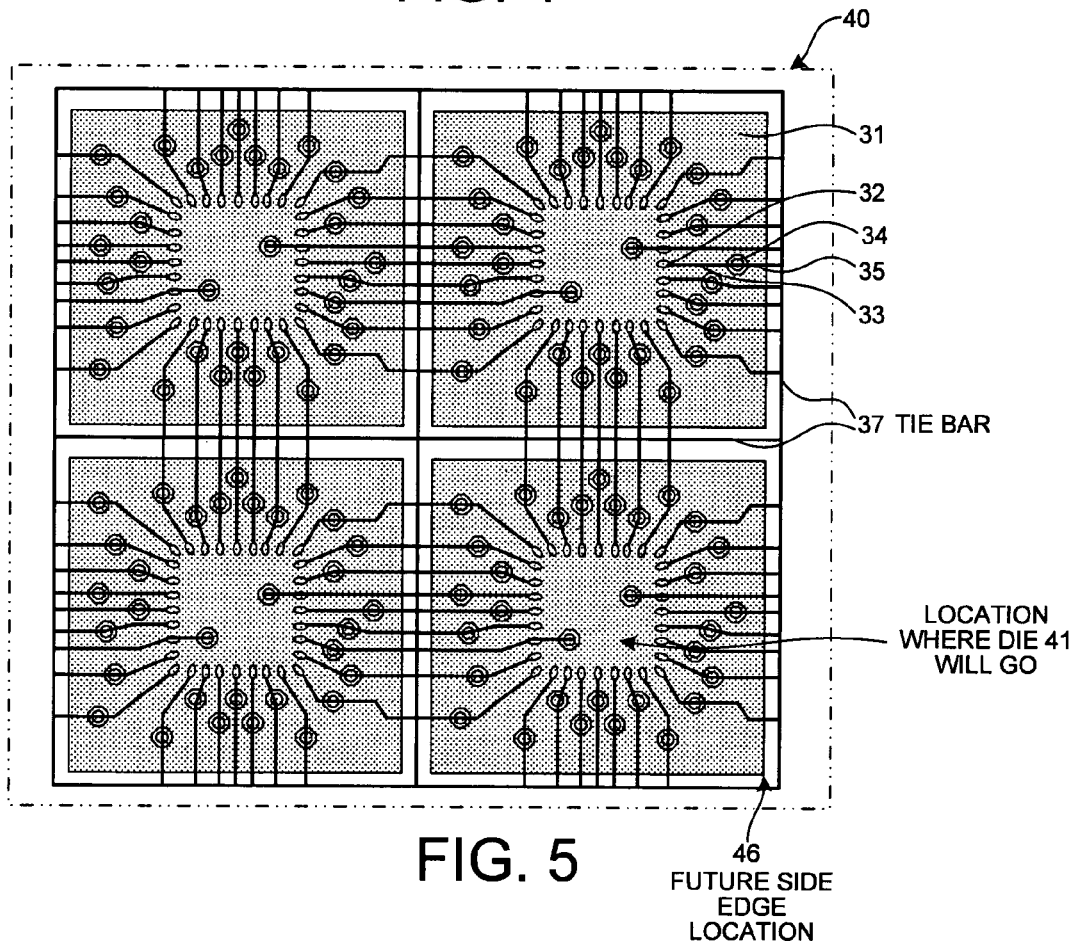
FIG. 5 is a top view of a PCB substrate panel during electroplating process. All the traces and bond pads are electrically connected together by a tie bar structure.

The manufacture of BGA packages is usually accomplished on a per substrate panel basis, with each panel consisting of anywhere from ten to fifty substrates. The manufacture typically includes the following steps: IC die and PCB substrate preparation, electroplating, etching, die attaching and bonding, encapsulation, and singulation. First, IC dies and appropriate substrates are prepared. FIG. 5 is a top view of a PCB substrate panel 40. In the example of FIG. 5, PCB substrate panel 40 includes multiple identical substrates arranged in an array as illustrated. In another example, the PCB substrate panel is a strip and the substrates are arranged side by side in single file along the strip. As illustrated in FIG. 5, the center square of substrate 31 is the location where die 41 will be attached later on. Substrate 31 also has a future side edge location 46. Future side edge location 46 is the location where each substrate will be separated in the final singulation process.

Next, bond pad 32 is electroplated with a layer of gold (all bond pads are electroplated at the same time and in the same way). Electroplating is a process of using electrical current to coat an electrically conductive object with a relatively thin layer of metal. Bond pad 32 is typically electroplated with a layer of gold because of the excellent conductive and mechanical properties of gold. In order to facilitate the electroplating process, an electrical path is provided from a tie bar 37, through stub trace 35, through trace 33, and to bond pad 32. As illustrated in FIG. 5, all the other bond pads are also coupled to the tie bar through similar stub traces connections. Thus, all bond pads on substrate 31 are electrically connected together to all other bond pads on the neighboring substrates through stub traces and tie bar 37.

Bond pad 32 is then electroplated with a layer of gold. In one example of the electroplating process, the part to be plated (for instance, bond pad 32) is a cathode of a circuit, and an anode of the circuit is made of the metal (for instance, gold) to be plated on the cathode. Both cathode and anode are immersed in a solution containing metal salts and ions that permit the flow of electricity. A rectifier supplies a direct current to the cathode causing the metal ions in solution to lose their charge and plate on the cathode. As the electrical current flows through the circuit, the anode slowly dissolves and replenishes the ions in the bath.

As illustrated in FIG. 5, stub trace 35 extends to future side edge location 46 and thereby facilitates the electroplating of the bond pad 32. As a consequence, if the substrates were simply separated from one another along the illustrated substrate side edges, then the resulting stub traces would be visible from the sides of the resulting IC packages. A possible attacker would be able to access data on IC buses on die 41 through the exposed ends of the stub traces. Therefore, it is desirable to remove a portion of stub trace 35 at future side edge location 46 of substrate 31 to prevent possible attackers. In one example, a portion of stub trace 35 is removed by an etching process. This etching is a process of using strong acid or other solution to remove unprotected parts of a metal surface.

FIG. 6 is a top view of a PCB substrate panel during the etching process in accordance with one novel aspect. As illustrated in FIG. 6, the top surface of substrate 31 is first covered by a pattern mask with openings for long strip 50 and for short strip 51. The purpose of the pattern mask is to expose the selected area through the openings while protecting rest of the surface of the substrate 31. Substrate 31 is then completely submerged in an acid that eats away the exposed metal through the openings. After the etching process, stub traces 35 no longer extend all the way to future side edge location 46 of substrate 31 and therefore would no longer be visible from the side of the IC package 30 of FIG. 4.

FIG. 7 is an expanded view of box 57 of FIG. 6. As illustrated in FIG. 7, long strip 50 is a strip about 200 micrometers wide that extends around the perimeter of substrate 31. Long strip 50 also has an outside boundary 58 that is close to but outside of future side edge location 46. Short strip 51 is a strip that extends across several stub traces and is located further away from future side edge 46 toward the center of substrate 31. In one example, copper trace 33 connects bond pad 32 to via 34. Stub trace 35 extends from via 34 toward future side edge location 46 as illustrated. After the etching process, stub trace 35 terminates about 200 micrometers inside of future side edge 46 due to long strip 50. In another example, copper trace 63 connects bond pad 62 to via 64, and stub trace 65 connects bond bad 62 toward future side edge location 46. After the etching process, stub trace 65 terminates about 200 micrometers inside of future side edge 46 due to long strip 50. In yet another example, copper trace 53 connects bond pad 52 to via 54, and also extends from via 54 toward future side edge location 46. After the etching process, the extension of trace 53 is disconnected and forms stub trace 55 and isolated stub trace segment 56 due to strips 51 and 50. Isolated stub trace segment 56 terminates about 200 micrometers inside of future side edge 46 due to long strip 50. Therefore, after the encapsulation of the substrate the ends of the traces and isolated stub traces will not be exposed on the outside of the package. As a result, it is more difficult for a possible attacker to access the IC busses from the side of the IC package 30 of FIG. 4.

After the etching process, die 41 is attached to substrate 31. In one example, die 41 is mounted and fixed to substrate 31 using an epoxy adhesive. Terminals on die 41 are then electrically connected to substrate 31 either by wirebonding or flip-chip connection.

FIG. 8 is a top view of PCB substrate panel 40 after the die attaching and bonding process. In the example of FIG. 8, die 41 is wire-bonded to substrate 31 using very fine bond wires (for instance, a bond wire 38 as illustrated in FIG. 8). Bond wire 38 is usually made either of gold (Au) or aluminum (Al).

The next step is the molding or encapsulation process. During the molding process, die 41 and bond wire 38 are encapsulated with plastic or epoxy or another encapsulant to prevent physical damage and corrosion.

FIG. 9 is a top view of PCB substrate panel 40 after the molding process. As illustrated in FIG. 9, encapsulation 42 extends to future side edge location 46. Because future side edge location 46 is close to but inside of outside boundary 58 of long strip 50, the stub traces do not extend to the edge of the encapsulant. The stub traces were previously etched away from this future side edge location 46 when strip 50 was etched away.

After encapsulation, solder ball preforms are placed on the solder ball attachment pads of the bottom surface of PCB substrate panel 40. The solder balls are then reflowed to form the final solder balls under the BGA package. Once the solder balls have been formed, the substrates are singulated from PCB substrate panel 40 either by shearing with a carbide-tipped tool, by routing with a programmable router, or by cutting with a diamond wheel. In the example of FIG. 9, PCB substrate panel 40 is cut along a line somewhere between future side edge location 46 and outside boundary 58.

FIG. 10 is a perspective view of individual BGA package 30 of FIG. 4. As illustrated in FIG. 10, the traces and stub traces no longer extend to side edge 36 and therefore are no longer visible from the side of BGA package 30. FIG. 11 is an exploded view of BGA package 30 of FIG. 10. In one example, electrical signals from IC die 41 are conducted to an external solder ball 43 through copper trace 33 and via 34. Without the novel etching step described above, stub trace 35 would extend from copper trace 33 toward side edge 36 and would be visible from the side of BGA package 30. A possible attacker may be able to monitor the electrical signals on these traces and may be able to learn how the IC processes secured data transactions. The attacker may then be able to develop methods of "fooling" or "tweaking" the data, and cause the central processing unit of the IC to execute malicious code. In accordance with one novel aspect described here, however, strip 50 is etched so that stub trace 35 terminates at a distance away from side edge 36 and is will not be exposed on the side of BGA package 30. Therefore, the novel etching step makes the monitoring signals on the traces much more difficult and is an advantageous approach for IC chips that are involved in security-sensitive applications.

In another example, electrical signals from IC die 41 are conducted to an external solder ball 66 through copper trace 53 and via 54. If the conducted electrical signals are extremely security-sensitive, then stub trace 55 is further disconnected and forms an isolated stub trace segment 56. As illustrated in FIG. 11, isolated stub trace segment 56 no longer conducts electrical signals. Therefore, even if the possible attacker were able to access isolated stub trace segment 56, the attacker would still not be able to monitor electrical signals on the traces going to/from IC die 41.

Although certain specific exemplary embodiments are described above in order to illustrate the invention, the invention is not limited to the specific embodiments. The etching of strips 50 and 51 to prevent traces from extending to exposed side edges of a package, which can also be applied to any secure signal trace elements on the solder ball side of the substrate 31, is not limited to use in a face-side-up wire-bonded package such as is shown in FIG. 4. Strip 50 need not be removed by etching, but rather can be removed by other means including, for example, sawing or drilling or grinding. The removal of strip 50 can be used to prevent traces from being exposed on side edges of other packages and substrates, including, for example, a BGA mesh cap. The BGA mesh cap includes a substrate and bond balls in a BGA array, where the substrate includes an anti-tamper mesh of conductors. These conductors are connected to bond balls of the BGA mesh cap such that the BGA mesh cap can be piggy-back mounted in a package-on-package (POP) fashion to another package in a way that an integrated circuit in the other package can monitor and control the anti-tamper mesh in the BGA mesh cap. The mesh conductors in the mesh cap do not extend to the side edges of the substrate due to the removal of strip 50, even though portions of the conductors may be electroplated using a tie bar. Accordingly, various modifications, adaptations, and combinations of various features of the described embodiments can be practiced without departing from the scope of the invention as set forth in the claims.

What is claimed is:

1. An integrated circuit package, comprising:
    (1) a plurality of package attachment terminals; and
    (2) a printed circuit board (PCB) substrate having a side edge, wherein the PCB substrate is non-conductive, comprising:
        (a) a plurality of electrically-conductive paths, wherein each one of the plurality of electrically-conductive paths comprises:
            (i) an electroplated bond pad;
            (ii) a trace, wherein the trace electrically couples the bond pad to a respective one of the plurality of package attachment terminals, wherein the electroplated bond pad is electroplated with a layer of gold, and wherein the trace is not plated with gold; and
            (iii) a stub trace, wherein the stub trace extends from the trace toward the side edge of the substrate, and wherein the stub trace is detached from a tie bar and terminates at a distance away from the side edge of the substrate; and
        (b) a plurality of isolated stub trace segments, wherein each of the plurality of isolated stub trace segments corresponds to one of the stub traces and is substantially collinear with at least a portion of the corresponding trace, and wherein each of the plurality of isolated stub trace segments terminates at a distance away from the side edge of the substrate.

2. The integrated circuit package of claim 1, wherein each one of the plurality of package attachment terminals is taken from the group consisting of: a solder ball, a land, a lead, and a pin.

3. The integrated circuit package of claim 1, wherein the package is a Ball Grid Array (BGA) package, wherein an integrated circuit is attached to a top surface of the PCB substrate, and wherein each of the plurality of package attachment terminals is a solder ball that is attached to a bottom surface of the PCB substrate.

4. The integrated circuit package of claim 1, wherein the PCB substrate comprises at least three isolated stub trace segments, and wherein at least three of the isolated stub trace segments are parallel with each other.

5. The integrated package of claim 1, wherein the package is encapsulated with an encapsulant, and wherein the encapsulant extends to the side edge of the substrate.

6. The integrated circuit package of claim 1, wherein each of the plurality of the electrically-conductive paths is electroplated with a layer of gold on its electroplated bond pad and wherein none of the electrically-conductive paths is electroplated with gold on its trace.

7. The integrated circuit package of claim 1, wherein at least one of the stub traces has a length of at least ten times of its width.

8. The integrated circuit package of claim 1, wherein the trace electrically couples the bond pad to the respective one of the plurality of package attachment terminals through a via, and wherein the stub trace starts from the via and terminates at the distance away from the side edge of the substrate.

9. The integrated circuit package of claim 1, wherein the trace electrically couples the bond pad to the respective one of the plurality of package attachment terminals through a via, and wherein the stub trace starts from the bond pad and terminates at the distance away from the side edge of the substrate.

10. The integrated circuit package of claim 1, wherein the stub trace is used to electroplate the electroplated bond pad.

11. The integrated circuit package of claim 1, wherein the side edge of the substrate is disposed on a lateral side of the integrated circuit package, and wherein the stub trace is not visible from the lateral side of the integrated circuit package.

12. The integrated circuit package of claim 1, wherein the distance is at least 200 micrometers.

13. The integrated circuit package of claim 1, wherein the integrated circuit package has an outside, and wherein the stub trace is not exposed on the outside of the integrated circuit package.

* * * * *